United States Patent [19]

Izumi et al.

[11] Patent Number: 5,003,692

[45] Date of Patent: Apr. 2, 1991

[54] ELECTRIC COMPONENT MOUNTING METHOD

[75] Inventors: Yasuo Izumi, Ikoma; Kazumi Ishimoto, Katano; Yutaka Makino, Kobe, all of Japan

[73] Assignee: Matsushita Electric Industrial Co., Ltd., Kadoma, Japan

[21] Appl. No.: 524,055

[22] Filed: May 16, 1990

[30] Foreign Application Priority Data

May 17, 1989 [JP] Japan .................................. 1-123221

[51] Int. Cl.[5] ............................................. H05K 3/30
[52] U.S. Cl. ....................................... 29/834; 29/740; 29/759; 29/833; 228/6.2
[58] Field of Search ................. 29/740, 840, 833, 759, 29/834; 228/6.2

[56] References Cited

U.S. PATENT DOCUMENTS

| 3,699,640 | 10/1972 | Cranston et al. | 228/6.2 X |
|---|---|---|---|
| 3,700,155 | 10/1972 | Hermanns | 228/6.2 |
| 3,700,156 | 10/1972 | Hermanns | 29/827 X |
| 3,724,068 | 4/1973 | Galli | 29/833 |
| 3,811,182 | 5/1974 | Ryan, Sr. et al. | 228/6.2 X |
| 4,010,885 | 3/1977 | Keizer et al. | 228/6.2 |
| 4,166,562 | 9/1979 | Keizer et al. | 228/6.2 X |
| 4,236,301 | 12/1980 | Hug et al. | 29/759 X |
| 4,458,412 | 7/1984 | Dean et al. | 29/759 X |
| 4,479,298 | 10/1984 | Hug | 228/6.2 X |
| 4,628,464 | 12/1986 | McConnell | 29/759 X |
| 4,670,981 | 6/1987 | Kubota et al. | 228/6.2 X |
| 4,675,993 | 6/1987 | Harada | 29/759 X |
| 4,727,645 | 3/1988 | Rodin et al. | 29/759 X |
| 4,731,923 | 3/1988 | Yagi et al. | 29/833 |
| 4,733,462 | 3/1988 | Kawatani | 29/759 X |
| 4,738,025 | 4/1988 | Arnold | 29/833 X |
| 4,742,947 | 5/1988 | Coffman et al. | 29/833 X |
| 4,763,405 | 8/1988 | Morito et al. | 29/740 |
| 4,794,689 | 1/1989 | Seno et al. | 29/740 |
| 4,844,324 | 7/1989 | Todd | 228/6.2 X |
| 4,868,973 | 9/1989 | Fujishiro | 29/740 |
| 4,875,279 | 10/1989 | Sakiadis | 29/740 |
| 4,875,614 | 10/1989 | Cipolla et al. | 228/6.2 X |
| 4,948,026 | 8/1990 | Fritsch | 228/6.2 |

OTHER PUBLICATIONS

IBM Tech. Disclosure Bull., vol. 27, No. 6, Nov. 1984, pp. 3653-3655 by Chester et al.
Western Electric Tech Digest, No. 46, Apr. 1977, pp. 5-6 by Booth et al.

Primary Examiner—Carl E. Hall
Assistant Examiner—Carl J. Arbes
Attorney, Agent, or Firm—Wenderoth, Lind & Ponack

[57] ABSTRACT

A component mounting method for successively mounting electric components on a printed circuit board, which method comprises the steps of recognizing the position of an electric component retained by a suction nozzle by the effect of a suction force; recognizing the predetermined mounting position on a printed circuit board or any other suitable substrate, at a location spaced a predetermined distance from the printed circuit board; mounting the electric component after the latter has been aligned with the predetermined mounting position on the printed circuit board; and recognizing, through the suction nozzle, the electric component to determine if the electric component has been mounted properly after the suction nozzle has been elevated to a position spaced a predetermined distance upwardly from the printed circuit board. In the event that the latter has been mounted incorrectly, information indicative of an incorrect mounting of the electric component is recorded in a control data.

3 Claims, 3 Drawing Sheets

ELECTRIC COMPONENT MOUNTING METHOD

BACKGROUND OF THE INVENTION

1. Field of the Invention

The present invention generally relates to the mounting of electric component parts successively on a printed circuit board by the utilization of a suction force for picking up electric component parts.

2. Description of the Prior Art

In order for an electric component to be mounted on a printed circuit board so accurately and so correctly as to allow the electric component to assume a predetermined position on the printed circuit board, the conventional practice makes use of a vision sensing system including video cameras for recognizing the position of the printed circuit board at which the electric component is to be actually mounted and also for recognizing the position of the electric component retained by the mounting head. When the component mounting apparatus is in operation, the system is cyclically sequenced to cause the video camera in the mounting head to recognize the position on the printed circuit board at which an electric component is to be mounted; then to cause the mounting head to be moved to a component supply station to pick up the electric component; to cause the video camera, fixed installed at a predetermined position on the path of travel of the electric component from the component supply station towards the component mounting station, to recognize the position of the electric component being transported towards the mounting station; to cause the electric component to be actually mounted so as to assume the predetermined position on the printed circuit board which has been recognized by the video camera; and finally to cause the video camera in the mounting head to recognize the position on the printed circuit board at which the next suceeding electric component is to be mounted.

According to the above discussed prior art component mounting method, the recognition of the electric component having been retained by the suction nozzle and the recognition of the mounting position on the printed circuit board are performed separately. Accordingly, not only is a relatively long time required to finish the task of recognition, but also a limitation is encountered in reducing the tact time incurred during the component mounting operation and also in improving the mounting accuracy. Considering the recent trend that the spacing between each neighboring lead lines extending outwardly from an electric component is reduced with an increase in number of the lead lines, demands have been made recently for achieving a highly accurate mounting of electric components and, therefore, the problems inherent in the prior art component mounting method can no longer be negligible.

Also, in order to avoid any possible spoilage of one or both of the electric component and the printed circuit board only because of a failure of the electric component to be properly mounted and/or a failure of the printed circuit board to receive the electric component, inspection is required to determine if the electric component has been properly mounted. According to the prior art component mounting method, not only is this inspection carried out separtely from the component mounting operation, but also the adjustment or repositioning of the electric component mounted incorrectly is performed manually, the productivity is relatively low.

SUMMARY OF THE INVENTION

In view of the foregoing problems inherent in the prior art component mounting method, the present invention has for its essential object to provide an improved component mounting method including an inspection to determine if the electric component has been properly mounted, which method is effective to mount electric components at high productivity while accomplishing an automatic adjustment or repositioning of the electric component which has been improperly mounted.

Another object of the present invention is to provide an improved component mounting method of the type referred to above, which is effective to permit the component mounting operation to be accomplished in a fully automated fashion while ensuring a reliably high productivity.

The present invention therefore provides a component mounting method which comprises the steps of recognizing the position of an electric component retained by a suction nozzle by the effect of a suction force; recognizing the predetermined mounting position on a support medium such as, for example, a printed circuit board or any other suitable substrate, at a location spaced a predetermined distance from the support medium; mounting the electric component after the latter has been aligned with the predetermined mounting position on the support medium; recognizing, through the suction nozzle, the electric component to determine if the electric component has been mounted properly after the suction nozzle has been elevated to a position spaced a predetermined distance upwardly from the support medium; and recording in a control data information indicative of an incorrect mounting of the electric component in the event that the latter has been mounted incorrectly.

According to another embodiment of the present invention, the step of recording the information in the control data is replaced by steps of picking up again the electric component which has been incorrectly mounted; recognizing, through the suction nozzle, the shape and posture of the electric component so picked up; mounting the electric component on the support medium after the electric component has been aligned with the predetermined mounting position on the support medium in the event that the shape and posture of the electric component are correct; and recognizing the electric component so mounted on the support medium. Also, should the shape and posture of the electric component be incorrect, such electric component may be discarded and information indicative of the incorrect shape and posture of the electric component may be recorded in the control data.

According to the present invention, the electric component and the mounting position on the support medium are directly recognized through the suction nozzle and the electric component is mounted on the support medium after it has been aligned with the predetermined mounting position, followed by the recognition of the manner in which the electric component has been mounted. Accordingly, it is possible to achieve a highly correct and reliable component mounting. In addition, since the recognition of the electric component, the predetermined mounting position and the manner in which the electric component has been mounted is carried out through the suction nozzle, the component mounting operation including the inspection can be accomplished by a minimized operation of the suction nozzle and the electric component can be mounted on the support medium at a high productivity. Moreover, should the result of recognition indicate that the electric component is incorrectly or improperly mounted, the information indicative of the incorrect or improper mounting can be recorded in the control data so that, during the subsequent step, the electric component incorrectly or improperly mounted can be discriminated for repairment or any other process.

Yet, where the result of inspection indicates that the electric component is improperly mounted, such electric component is again sucked onto the suction nozzle, followed by the recognition of the shape of the electric component to determine if, when the electric component is re-mounted, an electric shortcircuitting would occur as a result of deposits of cream or solder which have been formed during the previous mounting or if the electric component can be properly re-mounted. The actual re-mounting of the electric component takes place after the electric component recognized as having no problem has been aligned with the predetermined mounting position on the support medium. Therefore, a highly reliable component mounting can be accomplished, allowing the component mounting operation to be substantially fully automated.

In addition, if, in the event that the shape and posture of the electric component during the re-mounting are found to be defective, such electric component is discarded and the information indicative of it is recorded in the control data, the subsequent adjustment can readily be accomplished.

BRIEF DESCRIPTION OF THE DRAWINGS

These and other objects and features of the present invention will become clear from the description taken in conjunction with a preferred embodiment thereof with reference to the accompanying drawings, in which.

DETAILED DESCRIPTION OF THE EMBODIMENT

Figure 4:
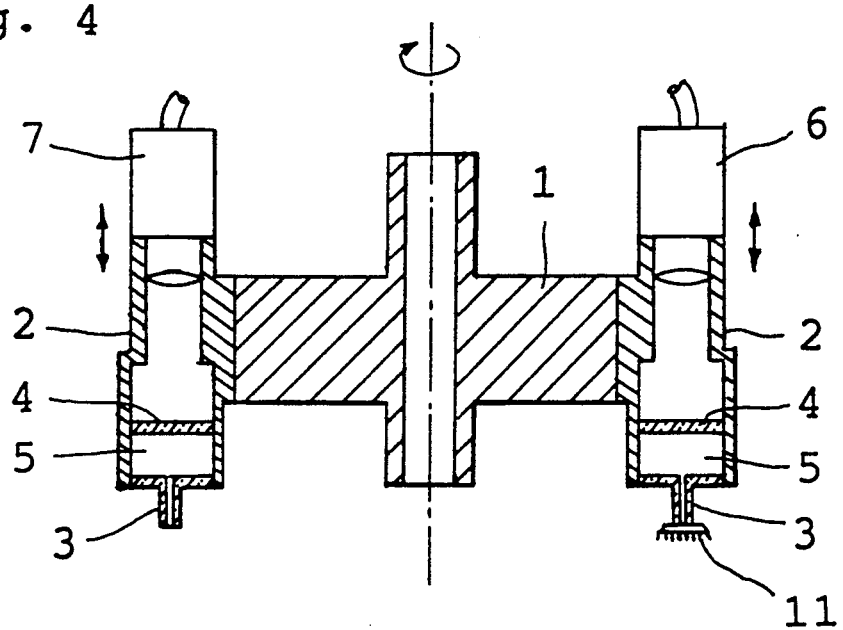
FIG. 4 is a schematic longitudinal sectional view of a portion of the component mounting apparatus.
Figure 5:
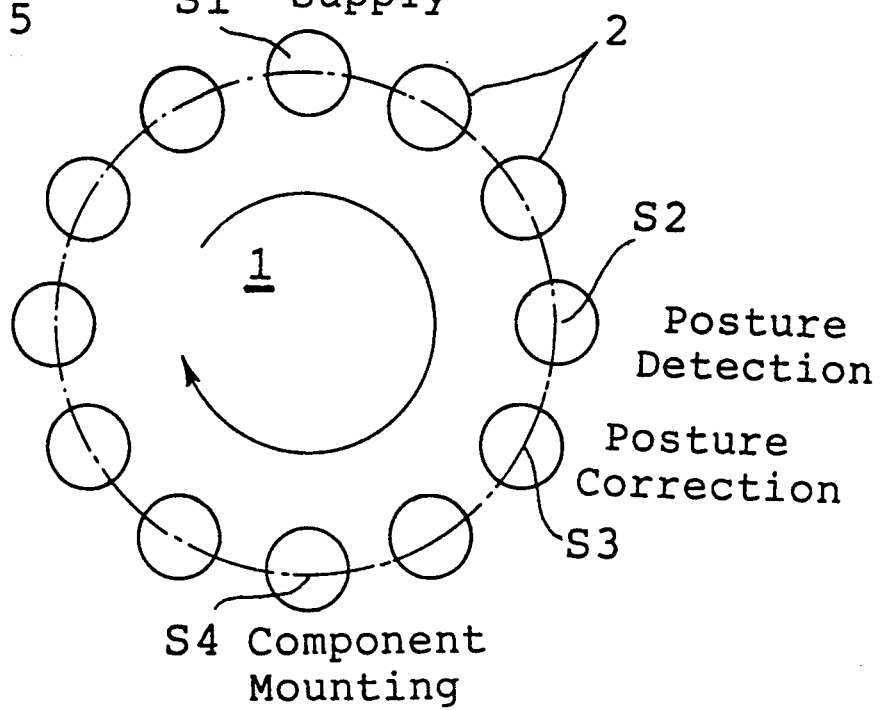
FIG. 5 is a schematic top plan view of that portion of the component mounting apparatus shown in FIG. 4.

Referring first to FIGS. 4 and 5, a component mounting apparatus capable of executing a component mounting method of the present invention comprises a turntable 1 supported for intermittent rotation in one direction about an axis, and a plurality of mounting heads 2 mounted on an outer peripheral portion of the turntable for movement up and down in a direction perpendicular to the turntable 1 and parallel to the axis of rotation of the turntable 1. The mounting heads 2 carried by the turntable 1 are spaced an equal distance from each other in a direction circumferentially of the turntable 1 and also from the axis of rotation of the turntable 1. Each of the mounting heads 2 has a lower open end to which a respective suction nozzle 3 is fitted for rotation about the axis thereof. So far illustrated, the suction nozzle 3 for each mounting head 2 is made of a light transmissive material and has a suction chamber 5 defined therein in cooperation with a light transmissive plate 4 positioned within the associated mounting head and above the suction nozzle 3, said suction chamber 5 being communicated through a suction passage (not shown) with a source of vacuum so that an electric component 11 can be sucked onto and retained by the suction nozzle 3.

As best shown in FIG. 5, during the intermittent rotation of the turntable 1, each of the mounting heads 2 can pass through a plurality of processing stations including a component supply station S1 at which the associated suction nozzle 3 can pick up an electric component 11 to be mounted on a support substrate, a posture detecting station S2 at which the posture of the electric component 11 retained by the suction nozzle 3 is checked, a posture correcting station S3 at which the posture of the electric component 11 which has been found having been improperly retained by the suction nozzle 3 is adjusted, or otherwise corrected, and a mounting station S4 at which the electric component 11 is actually mounted on the support substrate. As shown in FIG. 4, immediately above the component supply station S1 and the mounting station S4, first and second recognizing cameras 6 and 7 are disposed, respectively, in alignment with the path of travel of the mounting heads 2. Although not shown, a third recognizing camera is disposed at the posture detecting station S2 for recognizing the posture of the electric component 11 (the angular position about the axis of rotation of each suction nozzle 3) having been retained by the associated suction nozzle 3, and a drive means for driving each suction nozzle 3 is installed at the posture correcting station S3.

Alternatively, the recognizing camera may be mounted atop each of the mounting heads 2.

Figure 1:
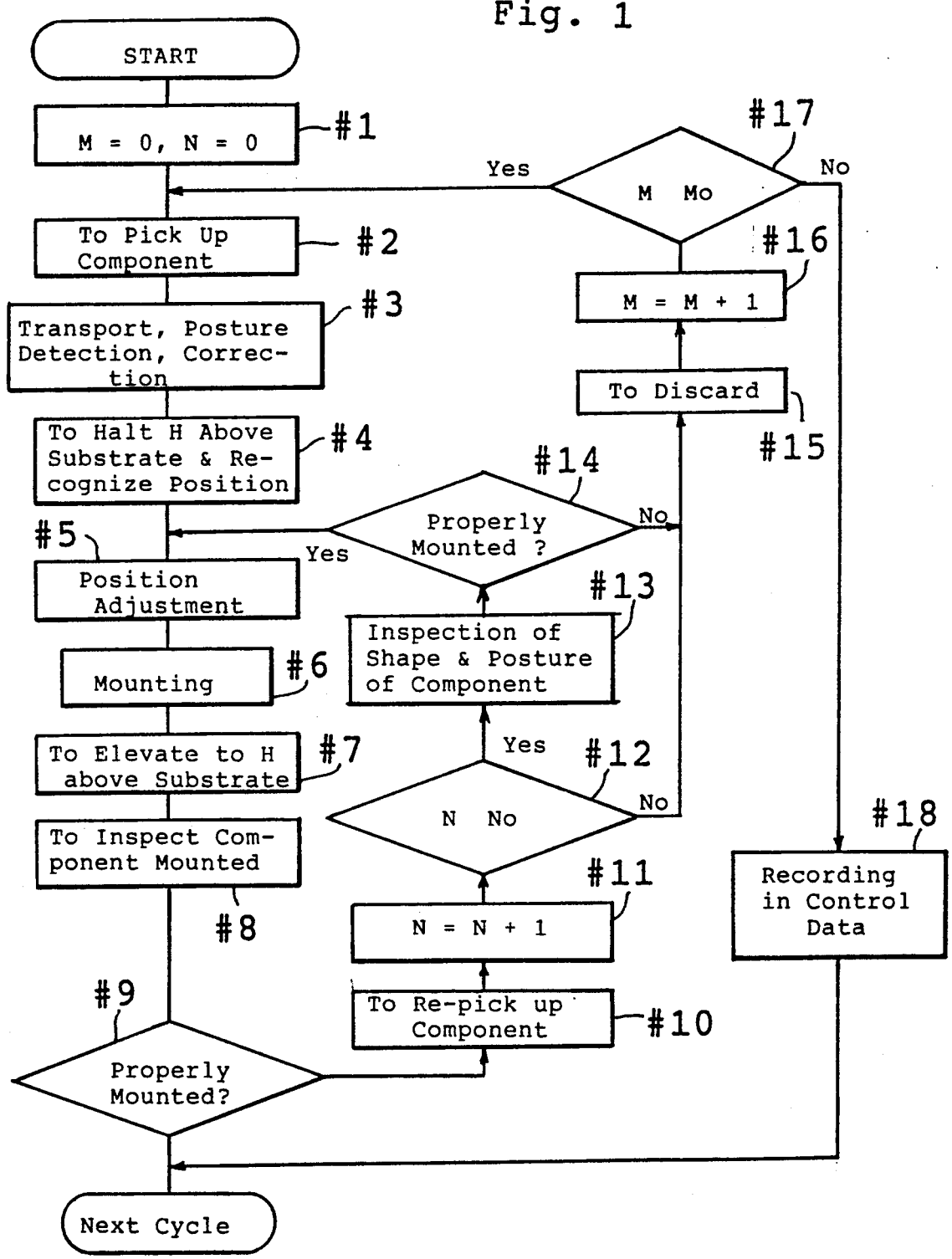
FIG. 1 is a flowchart showing the sequence of operation of a component mounting apparatus which performs a component mounting method of the present invention.

Hereinafter, the component mounting operation will be described with particular reference to FIGS. 1 to 3. At the outset, M and N for counting the number of replacement of the electric component 11 and the number of re-mounting thereof, respectively, are set to zero at step 190 1, followed by step 190 2 at which the electric component 11 is sucked onto and retained by the suction nozzle 3 at the component supply station S1. At this time, prior to the suction of the electric component 11 onto the suction nozzle 3, the first recognizing camera 6 recognizes the shape of the electric component 11 and, if the shape of the electric component 11 is not proper, the next adjacent electric component 11 is sucked onto and retained by the suction nozzle 3. During the continued intermittent rotation of the turntable 1, the electric component 11 so retained by the suction nozzle 3 is transported towards the component mounting station S4 and, on its way towards the component mounting station S4, the posture of the electric component 11 retained by the suction nozzle 3 by the effect of a vacuum force is recognized at the posture detecting station S2 and, if the necessity arises, the posture of the electric component 11 is subsequently changed, adjusted or modified relative to the longitudinal axis of the suction nozzle 3 at step #3.

At the mounting station S4, the support substrate, identified by 12, is mounted on an X-Y movable table (not shown) for adjustment in position thereof relative to one of the mounting heads 2 which has been brought to the mounting station S4 can be adjustable, so that, when such one of the mounting heads 2 is brought to the mounting station S4, a predetermined mounting position on the support substrate 12 can be brought into alignment with the electric component 11 then brought to the mounting station S4.

Figure 2:
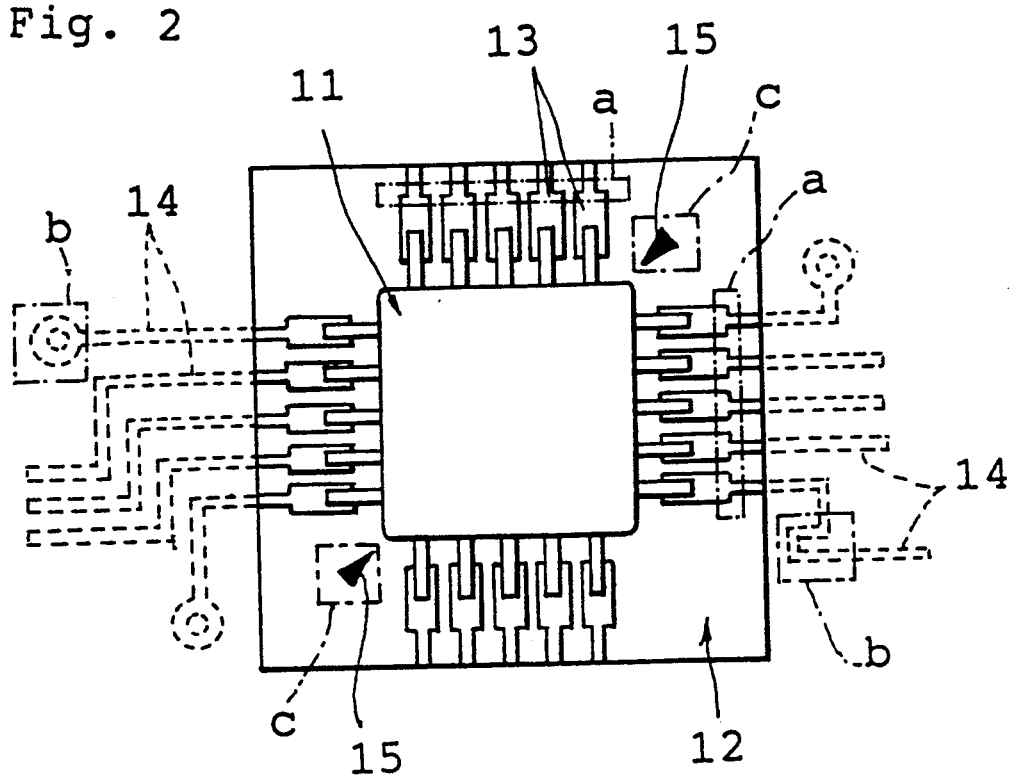
FIG. 2 is a top plan view of an electric component part, showing mounting position on a support substrate at which electric components are to be mounted.
Figure 3:
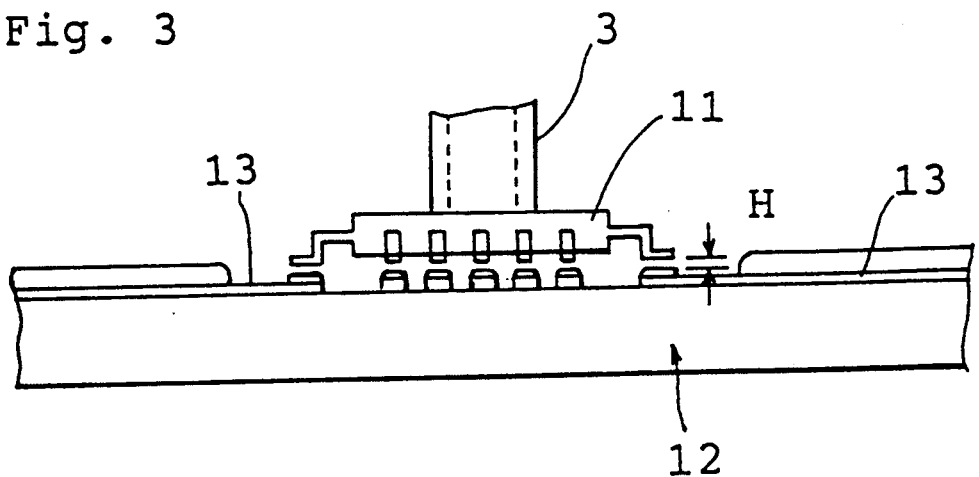
FIG. 3 is a schematic side view of the electric component part shown in FIG. 3.

When the suction nozzle 3 is brought to a position immediately above the mounting station S4, such suction nozzle 3 is lowered to a position at which the lowermost level of the electric component 11 carried by such suction nozzle 3 is spaced a predetermined distance H upwardly from the support substrate 12 as shown in FIGS. 2 and 3, and the second recognizing camera 7 then recognizes the position of the electric component 11 and, at the same time, the predetermined mounting position on the support substrate 12 at step #4. The second recognizing camera 7 has a depth of field required for the electric component 11 retained by the associated suction nozzle 3 and the predetermined mounting position on the support substrate 12 to be substantially focused. The recognition of the predetermined mounting position on the support substrate 12 is achieved by aligning a portion situated outside the electric component 11, that is, a unique portion of one of electrodes 13 with which the electric component 11 is to be connected, a unique portion of a wiring circuit 14 or a marking 15 used for the recognition of position formed at the mounting position with a corresponding window a, b or c, respectively.

Thereafter, based on both of the position of the electric component and the predetermined mounting position so recognized, the relative position of the electric component 11 is adjusted so that the electric component 11 can be aligned with the predetermined mounting position on the support substrate 12. In the illustrated embodiment, the position of the support substrate 12 is adjusted at step #5 so as to cause the predetermined mounting position on the support substrate 12 to be aligned with the electric component 11 retained by the associated suction nozzle 3 then brought to the mounting station S4. Then, the associated mounting head 3 is lowered to allow the electric component 11 to be actually mounted onto the support substrate 12 at step #6, followed by step #7 at which the suction nozzle 3 is shifted upwards from the support substrate 12 to a position spaced the predetermined distance H from the support substrate 12 and the mounting of the electric component 11 on the support substrate 12 is subsequently inspected at step #8 by the second recognizing camera 7.

Then, at step #9, a decision is made to determine if the result of inspection at step #8 indicates that the mounting of the electric component 11 on the support substrate 12 has been properly done. Should the result of decision at step #9 indicates that the electric component 11 has been properly and correctly mounted on the support substrate, the next succeeding cycle of component mounting operation takes place, but if the result of decision at step #9 indicates that the electric component 11 has not been properly and correctly mounted, the suction nozzle 3 is lowered to pick up the electric component 11 once mounted and is subsequently elevated at step 190 10.

After N has been incremented by 1 at step #11, a decision is made at step #12 to determine if N is smaller than a predetermined No. No represents the predetermined number of times over which an identical electric component is re-mounted and, if No is set to be 2, only one time re-mounting of the electric component is carried out. Normally, since, where the mounting of the electric component cannot be remedied even if it has been re-mounted, the possibility may be low that a repeated mounting of such electric component would not result in the correct and accurate mounting of such electric component, No is set to be 2. Where N is smaller than No, the shape and posture of the electric component 11 which has been picked up again by the suction nozzle are inspected at step #13 so that the re-mounting of the electric component 11 can be avoided in the event that an electrical shortcircuitting is likely to occur as a result of deposits of cream solder sticking out from the electric component 11 or in the event that the electric component is likely to be sucked in a wrong posture or to result in an improper mounting on the support substrate. The result of inspection is checked at step #14, and, if it indicate that the electric component 11 has been properly re-sucked, the program flow returns to step #5 to continue the mounting of the electric component in a manner as hereinbefore described.

However, where the result of decision at step #12 indicates that N is not smaller than No and the result of decision at step #14 subsequently indicates that the shape or posture of the electric component having been sucked is improper, the electric component 11 sucked onto the suction nozzle 3 is discarded at step #15 and, then at step #16, M is incremented by 1, followed by step #17 at which a decision is made to determine if M is smaller than a predetermined Mo. Mo represents the number of times over which, with respect to the identical predetermined mounting position on the support substrate, the electric component is replaced for mounting and, therefore, if Mo is set to be 2, the electric component can be replaced only one time. Where the re-sucking of the electric component once mounted results in a removal of deposits of cream solder at the predetermined mounting position and, however, the replacement of the electric component with another one would not result in a proper mounting, Mo is generally set to be 1. Should M be smaller than Mo, the program flow return to step #2 at which a new electric component 11 of the same type as that having been discarded is sucked onto the suction nozzle 3 for the subsequent mounting onto the support substrate 12.

On the other hand, where the result of decision at step #17 indicates that M is not smaller than Mo, it means that the mounting of the electric component on the predetermined mounting position on the support substrate 12 is impossible, and therefore, at subsequent step #18, information indicating that the mounting of the electric component on the predetermined mounting position on the support substrate 12 is impossible is recorded in an NC control data, followed by the next cycle of mounting operation during which the next succeeding electric component is mounted.

In the manner as hereinbefore fully described, not only can the electric component 11 be mounted precisely and correctly onto the predetermined mounting position on the support substrate 12 and be subsequently automatically inspected to determine if it has been properly and correctly mounted, but also the rectification of the electric component which has been incorrectly or improperly mounted, but can be remedied can be accomplished automatically. Therefore, with the component mounting method of the present invention, not only is a highly precise and reliable component mounting accomplished automatically, but also the component mounting operation can be performed in a fully automated fashion with no manual intervention required.

It is to be noted that, when all required electric components 12 have been mounted on the single support substrate 11, such support substrate 11 with the electric components 12 mounted thereon is transported to the subsequent processing station and, however, the support substrate having one or some of the electric components which have been mounted thereon improperly or incorrectly and/or which have missed, is transported through a separate route to a rectifying station at which the improperly or incorrectly mounted electric components are rectified or the missing electric component parts are re-mounted on the basis of the NC control data.

Thus, according to the present invention, the electric component and the mounting position on the support substrate are directly recognized through the suction nozzle and the electric component is mounted on the support substrate after it has been aligned with the predetermined mounting position, followed by the recognition of the manner in which the electric component has been mounted. Accordingly, it is possible to achieve a highly correct and reliable component mounting. In addition, since the recognition of the electric component, the predetermined mounting position and the manner in which the electric component has been mounted is carried out through the suction nozzle, the component mounting operation including the inspection can be accomplished by a minimized operation of the suction nozzle and the electric component can be mounted on the support substrate at a high productivity. Moreover, should the result of recognition indicate that the electric component is incorrectly or improperly mounted, the information indicative of the incorrect or improper mounting can be recorded in the control data so that, during the subsequent step, the electric component incorrectly or improperly mounted can be discriminated for repairment or any other process.

Yet, where the result of inspection indicates that the electric component is improperly mounted, such electric component is again sucked onto the suction nozzle, followed by the recognition of the shape of the electric component to determine if, when the electric component is re-mounted, an electric shortcircuitting would occur as a result of deposits of cream or solder which have been formed during the previous mounting or if the electric component can be properly re-mounted. The actual re-mounting of the electric component takes place after the electric component recognized as having no problem has been aligned with the predetermined mounting position on the support substrate. Therefore, a highly reliable component mounting can be accomplished, allowing the component mounting operation to be substantially fully automated.

In addition, if, in the event that the shape and posture of the electric component during the re-mounting are found to be defective, such electric component is discarded and the information indicative of it is recorded in the control data, the subsequent adjustment can readily be accomplished.

Although the present invention has been fully described in connection with the preferred embodiment thereof with reference to the accompanying drawings, it is to be noted that various changes and modifications are apparent to those skilled in the art. By way of example, where the support substrate has been found having at least one electric component mounted improperly or incorrectly, no rectification may be effected to such support substrate and, instead, recording is made in the NC control data while permitting the machine to continue its component mounting operation subject to the next succeeding electric components.

In addition, although in the foregoing illustrated embodiment the mounting heads have been described and shown as mounted on the turntable rotatable in one direction, the present invention can be equally applicable to the component mounting apparatus of a type wherein the mounting heads are movable in X-axis and Y-axis directions perpendicular to each other between the component supply station and the mounting station.

Accordingly, such changes and modifications are to be understood as included within the scope of the present invention as defined by the appended claims, unless they depart therefrom.

What is claimed is:

1. A component mounting method which comprises the steps of:
    recognizing the position of an electric component retained by a suction nozzle by the effect of a suction force;
    recognizing the predetermined mounting position on a support medium such as, for example, a printed circuit board or any other suitable substrate, at a location spaced a predetermined distance from the support medium;
    mounting the electric component after the latter has been aligned with the predetermined mounting position on the support medium;
    recognizing, through the suction nozzle, the electric component to determine if the electric component has been mounted properly after the suction nozzle has been elevated to a position spaced a predetermined distance upwardly from the support medium; and
    recording in a control data information indicative of an incorrect mounting of the electric component in the event that the latter has been mounted incorrectly.

2. A component mounting method which comprises the steps of:
    recognizing the position of an electric component retained by a suction nozzle by the effect of a suction force;
    recognizing the predetermined mounting position on a support medium such as, for example, a printed circuit board or any other suitable substrate, at a location spaced a predetermined distance from the support medium;
    mounting the electric component after the latter has been aligned with the predetermined mounting position on the support medium;
    recognizing, through the suction nozzle, the electric component to determine if the electric component has been mounted properly after the suction nozzle has been elevated to a postion spaced a predetermined distance upwardly from the support medium;
    picking up again the electric component which has been incorrectly mounted;
    recognizing, through the suction nozzle, the shape and posture of the electric component so picked up;

mounting the electric component on the support medium after the electric component has been aligned with the predetermined mounting position on the support medium in the event that the shape and posture of the electric component are correct; and recognizing the electric component so mounted on the support medium.

3. The method as claimed in claim 2, wherein, in the event that the shape and posture of the electric component which has been re-picked up are defective, said electric component is discarded and information indicative thereof is recorded in the control data.

* * * * *